US005981304A

United States Patent [19]

Perrin et al.

[11] Patent Number: 5,981,304

[45] Date of Patent: Nov. 9, 1999

[54] SELF-ALIGNMENT PROCESS USABLE IN MICROELECTRONICS, AND APPLICATION TO CREATING A FOCUSING GRID FOR MICROPOINT FLAT SCREENS

[75] Inventors: Aimé Perrin, St. Ismier; Brigitte Montmayeul, Bernin, both of France

[73] Assignee: Commissariat a l'Energie Atomique, France

[21] Appl. No.: 08/992,697

[22] Filed: Dec. 17, 1997

[30] Foreign Application Priority Data

Dec. 30, 1996 [FR] France .................................. 96 16196

[51] Int. Cl.[6] ........................ H01L 21/00; H01L 21/4763; H01L 21/302; C23F 1/00

[52] U.S. Cl. ............................ 438/20; 438/638; 438/738; 216/2; 216/11; 445/24; 445/50

[58] Field of Search ............................ 216/2, 11; 445/24, 445/50; 438/20, 637, 638, 738

[56] References Cited

U.S. PATENT DOCUMENTS 5,676,818 10/1997 Delapierre et al. ..................... 205/664

FOREIGN PATENT DOCUMENTS 0 234 989 9/1987 European Pat. Off. .
0 545 621 6/1993 European Pat. Off. .
0 697 710 2/1996 European Pat. Off. .

*Primary Examiner*—Yogendra Gupta
*Assistant Examiner*—Brian P. Mruk
*Attorney, Agent, or Firm*—Burns, Doane, Swecker & Mathis LLP

[57] ABSTRACT

Self-alignment process usable in microelectronics to obtain alignment of at least one group of holes, one of said holes (or large diameter hole) being formed in an upper level and the other hole (or small diameter hole) being formed in a lower level of a stacked structure. The process consists of:

providing a conducting layer in the structure, said conducting layer possibly being connected to an external electrical circuit, disposing an insulating layer on said conducting layer, piercing the insulating layer with a hole of said small diameter that penetrates as far as the conducting layer, carrying out an electrolytic deposit of a conducting material in the small diameter hole using the conducting layer as the electrode during the electrolysis procedure, said electrolytic deposit filling the small diameter hole from the conducting layer and causing the deposit to overflow onto said insulating layer to give the electrolytically deposited conducting material the shape of a mushroom whose head rests on said insulating layer, the electrolytic deposition being continued until the diameter of the mushroom head attains the size of the large diameter, depositing on the structure thereby obtained a layer of a different type of material from the electrolytically deposited conducting material, removing the mushroom, thereby leaving a large diameter hole aligned with a small diameter hole in the last layer deposited.

9 Claims, 3 Drawing Sheets

SELF-ALIGNMENT PROCESS USABLE IN MICROELECTRONICS, AND APPLICATION TO CREATING A FOCUSING GRID FOR MICROPOINT FLAT SCREENS

This invention relates to a self-alignment process usable in microelectronics to obtain alignment of holes formed at different levels. The process can be applied in particular to creating a focusing grid for micropoint flat screens.

When, in order to create a microelectronics structure, several layers are required, each comprising a pattern or set of patterns, and said layers are created using photomasking techniques, each layer must be positioned in relation to the preceding layer using suitably placed alignment marks. This method is difficult to implement if one of the layers demands great positioning accuracy and becomes unusable if one of the layers is composed of randomly disposed patterns.

An example of a microelectronics structure that requires considerable accuracy in the positioning of its various layers is a micropoint flat screen. Documents FR-A-2 593 953 and FR-A-2 623 013 disclose this type of display apparatus that operates by cathodoluminescence excited by field emission. These apparatuses comprise an electron source that emits through micropoints.

Figure 1:
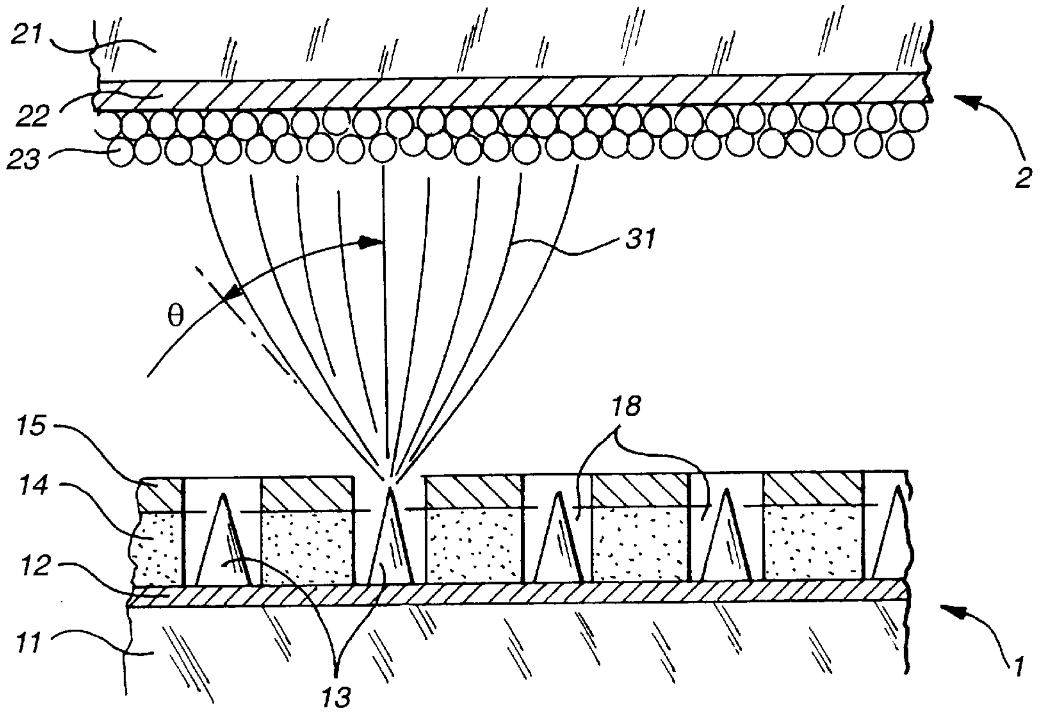

As an example, FIG. 1 is a cross-section view of this type of micropoint display screen. In order to make the figure simpler only a few aligned micropoints are shown. The screen consists of a cathode 1 that is a flat structure disposed facing another flat structure that constitutes anode 2. Cathode 1 and anode 2 are separated by a space in which a vacuum has been created. Cathode 1 comprises a glass substrate 11 on which conducting layer 12 is disposed in contact with electron emitting points 13. Conducting layer 12 is covered with an insulating layer 14 made, for example, of silicon, that is itself covered with a conducting layer 15. Holes 18 approximately 1.3 μm in diameter are pierced through layers 14 and 15 as far as conducting layer 12 to dispose points 13 on said conducting layer. Conducting layer 15 acts as an extracting grid for the electrons emitted by points 13. Anode 2 comprises a transparent substrate 21 on which luminescent phosphorus particles 23 are deposited.

The operation of the screen will now be described. Anode 2 is subjected to a positive voltage of several hundred volts relative to points 13 (typically 200 to 500 V). A positive voltage of a few tens of volts (typically 60 to 100 V) relative to points 13 is applied to extraction grid 15. Electrons are forced off points 13 and attracted by anode 2. The trajectories of the electrons form a half angle cone with a peak θ determined by various parameters including the shape of points 13. This angle causing unfocusing of electron beam 31 whose magnitude is greater the larger the distance between the anode and the cathode. One of the ways the efficiency of the phosphorus particles, and thus the luminescence of the screens, can be increased is to use higher anode-cathode voltages (between 1,000 and 5,000 V), which means increasing the gap between the anode and the cathode to avoid the creation of an electrical arc between these two electrodes.

If good anode definition is required the electron beam must be refocused. This refocusing is normally done using a grid that may be disposed either between the anode and the cathode or on the cathode.

Figure 2:
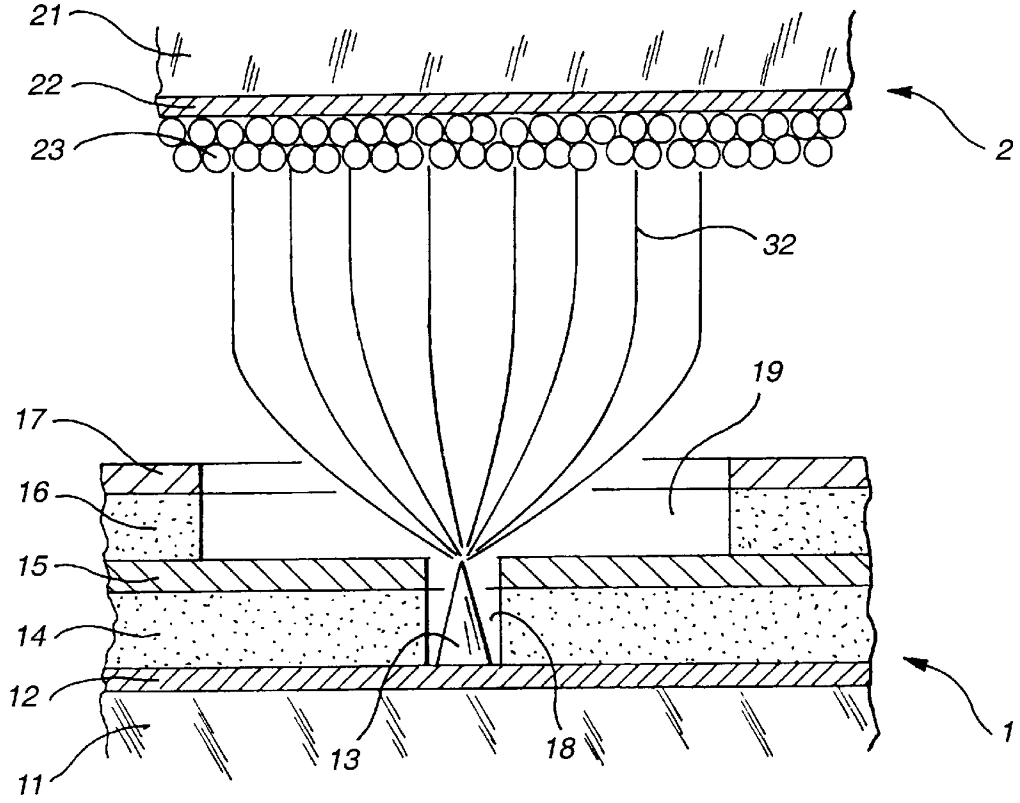

FIG. 2 shows a configuration in which the focusing grid is disposed on the cathode. FIG. 2 reproduces the example shown in FIG. 1 but only shows one micropoint for greater clarity. An insulating layer 16 is disposed on extraction grid 15 and bears a metallic layer 17 that acts as the focusing grid. Holes 19 of a suitable diameter (typically between 8 and 10 μm) and concentric with holes 18 are etched in layers 16 and 17. Insulating layer 16 electrically insulates extraction grid 15 and focusing grid 17. The focusing grid is polarized in relation to the anode such as to give electron beam 32 the shape shown in FIG. 2.

Simulation calculations show that the centering of the holes in the focusing grid with those in the extraction grid is critical. Producing focusing grids using the usual photomasking technology is thus difficult, especially where large surface screens are concerned. Furthermore if the holes in the extraction grid are made using a network of micropellets, they will be randomly disposed, thereby ruling out the use of photomasking to create the holes in the focusing grid.

The process of the invention makes it possible to align holes formed at different levels. It is particularly useful for creating the focusing grid of a micropoint flat screen. This process consists of using the patterns of the previous layer to produce the mask for a given layer, thereby self-aligning said layer with the previous layer. Once the layer in question has been created (usually by means of depositing or etching techniques), the mask may be removed, for example by dissolving it.

The invention therefore relates to a self-alignment process usable in microelectronics to obtain alignment of at least one set of two holes, one such hole (a hole with a large diameter) being formed in an upper layer while the other hole (with a small diameter) is formed in a lower layer of a stacked structure, characterized by the fact that it consists of:

- providing a conducting layer in the structure, said conducting layer possibly being connected to an external electrical circuit,
- disposing an insulating layer on said conducting layer,
- piercing the insulating layer with a hole of said small diameter that penetrates as far as the conducting layer,
- carrying out an electrolytic deposit of a conducting material in the small diameter hole using the conducting layer as the electrode during the electrolysis procedure, said electrolytic deposit filling the small diameter hole from the conducting layer and causing the deposit to overflow onto said insulting layer to give the electrolytically deposited conducting material the shape of a mushroom whose head rests on said insulating layer, the electrolytic deposition being continued until the diameter of the mushroom head attains the size of the large diameter,
- depositing on the structure thereby obtained a layer of a different type of material from the electrolytically deposited conducting material,
- removing the mushroom, thereby leaving a large diameter hole aligned with a small diameter hole in the last layer deposited.

This layer of a different type of material from the electrolytically deposited conducting material may be deposited using a depositing technique suitable for the material and carried out in a vacuum, such as evaporation, cathodic sputtering, etc.

The process may also comprise stages consisting in:

- firstly deepening the small diameter hole to a given first level,
- then deepening the large diameter hole to a given second level that lies between the upper surface of the insulating layer and the given first layer.

The invention also relates to a process for self-aligning the focusing grid with the extraction grid in a micropoint cathode, said micropoints being formed on a conducting layer and each micropoint being aligned with a small diameter hole in the extraction grid and with a large diameter hole in the corresponding focusing grid, said process comprising:

- a stage in which a first insulating layer is deposited on the conducting layer,
- a stage in which a first conducting layer is deposited to form the extraction grid on the first insulating layer,
- a stage in which a second insulating layer is deposited on the first conducting layer,
- a stage that consists of piercing the second insulating layer with small diameter holes that penetrate as far as the first conducting layer,
- a stage in which a conducting material is electrolytically deposited in the small diameter holes, the first conducting layer acting as the electrode during the electrolysis procedure, said electrolytic deposit filling the small diameter holes beginning at the first conducting layer and overflowing onto said second insulating layer to give the electrolytically deposited conducting material the shape of mushrooms whose heads rest on said second insulating layer, the electrolytic deposition being continued until the diameter of the mushroom heads attains the size of the large diameter,
- a stage in which a second conducting layer is deposited on the structure thereby obtained, said second conducting layer being designed to form the focusing grid and made of a different type of material from the electrolytically deposited conducting material,
- a stage in which the mushrooms are eliminated to leave large diameter holes in the second conducting layer, said holes being aligned with the small diameter holes,
- a stage in which the small diameter holes are deepened to reach the first conducting layer,
- a stage in which the large diameter holes are deepened to reach the first conducting layer,
- a stage in which the micropoints are formed.

This layer of a different type of material from the electrolytically deposited conducting material may be deposited using a depositing technique suitable for the material and carried out in a vacuum, such as evaporation, cathodic sputtering, etc.

The stages in which the small and large diameter holes are deepened are preferably performed at the same time.

Other characteristics and advantages of the present invention will be better understood from the following detailed description. The description is a non limitative example and refers to the attached figures where:

- FIGS. 1 and 2 show a micropoint flat screen known in the art,
- FIGS. 3A to 3H show the process of the present invention applied to producing a micropoint cathode provided with a focusing grid.

As an example, the rest of the description refers to producing a micropoint cathode provided with an electron focusing grid. In order to make the description simpler only a single micropoint is shown even though the invention enables a plurality of points to be produced simultaneously. The screen is of the matrix accessed type, the column electrodes being disposed on the cathode.

Figure 3A:
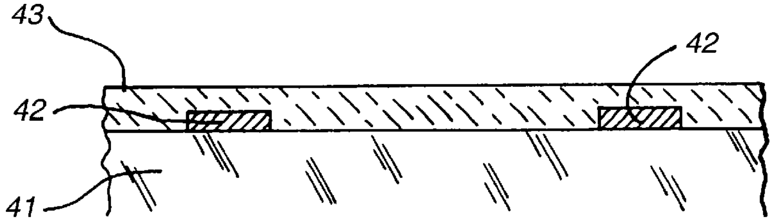
Figure 3B:
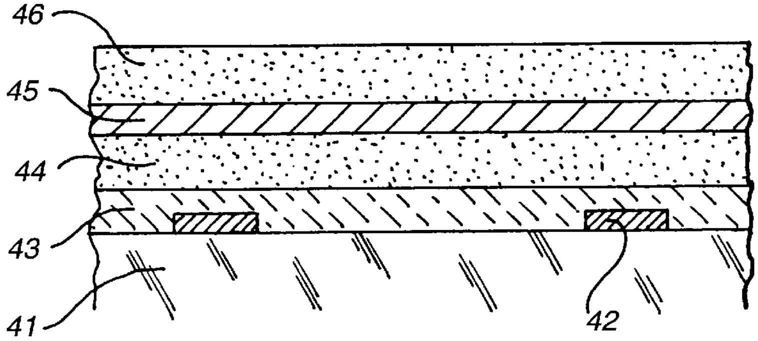
Figure 3C:
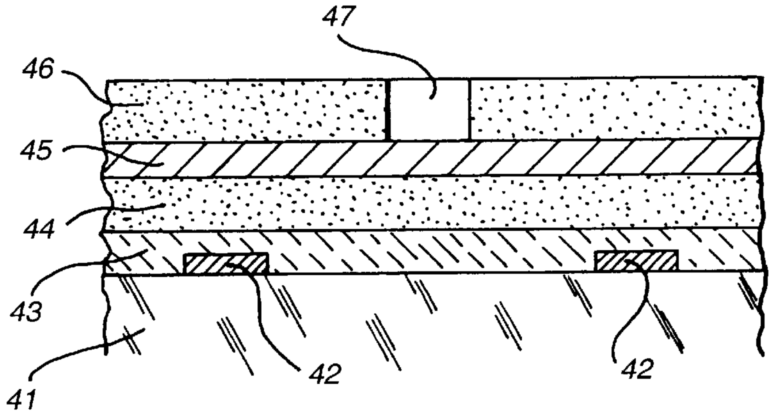
Figure 3D:
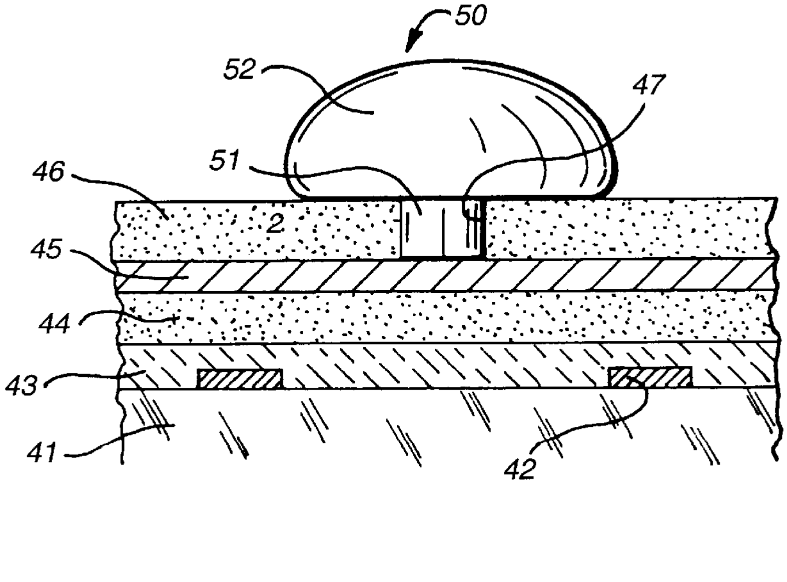
Figure 3E:
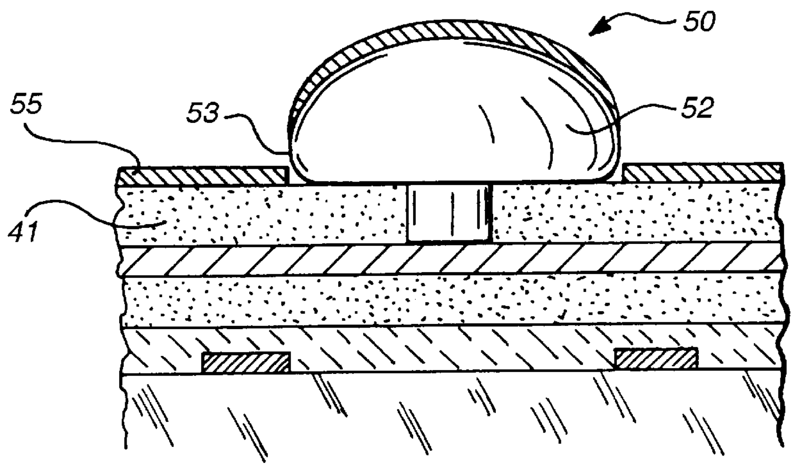
Figure 3F:
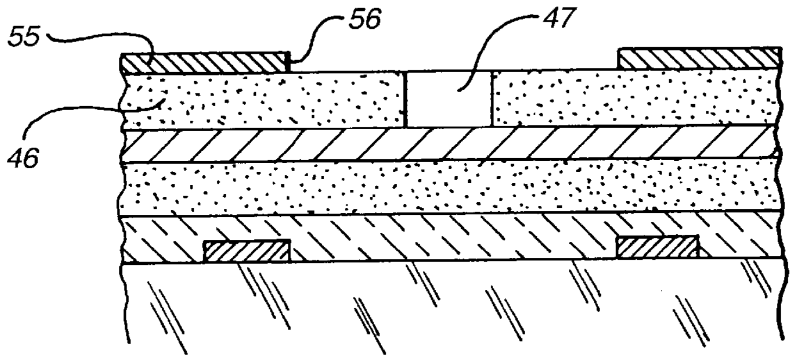

FIG. 3A is a cross-section view and shows the preliminary stages in the creation of a micropoint cathode. A glass strip 41 bears a metallic layer that has been disposed on the strip and etched to constitute columns 42, together with a resistant layer 43. These various layers are disposed conventionally.

Onto resistant layer 43 are successively disposed (see FIG. 3B) an insulating layer 44, a conducting layer 45 and an insulating layer 46. Insulating layers 44 and 46 may be made of silicon. Conducting layer 45 may be made of niobium and is designed to form the electron extraction grid.

The next stage consists in etching holes in insulating layer 46. These holes may be created either by using a photomask or a network of micropellets. If a photomask is used a layer of resin is deposited on insulating layer 46. This layer of resin is insulated through a mask. After developing, insulating layer 46 is etched as far as metallic layer 45. Any remaining resin is then dissolved. This produces the structure shown in FIG. 3C where a single hole 47 is shown.

The next stage is an essential stage of the present invention. During this stage a conducting material (e.g. an iron-nickel alloy) is electrolytically deposited on the exposed sections of conducting layer 45, i.e. at the bottom of the holes 47. The thickness of the electrolytic deposit is regulated to produce a mushroom 50 in each hole (see FIG. 3D) such that the stem of the mushroom fills the hole 47 and the head 52 spreads out over the upper layer of insulating layer 46 until the diameter of head 52 reaches the required diameter of a focusing grid hole.

A depositing technique suitable for the material and carried out in a vacuum is then used to deposit (see FIG. 3E) a conducting layer to produce the focusing grid 55 on the upper surface of the structure thus produced. This conducting layer is deposited on the heads 52 of mushrooms 50 and the sections of insulating layer 46 left exposed by the mushrooms. Each mushroom head then acts to mask the opening of focusing grid 55 around hole 47. This opening is automatically aligned with hole 47. It will be noted that section 53 of head 52, tangential to the conducting layer forming the focusing grid 55, is virtually not covered.

The conducting layer forming focusing grid 55 may be made of metal or any other slightly conducting material, e.g. a metallic oxide.

The mushrooms are subsequently dissolved chemically, the dissolving agent acting on section 53 of head 52. As can be seen from FIG. 3F, this produces a focusing grid 55 in which the holes 56 are self-aligned with the holes 47 in insulating layer 46.

Figure 3G:
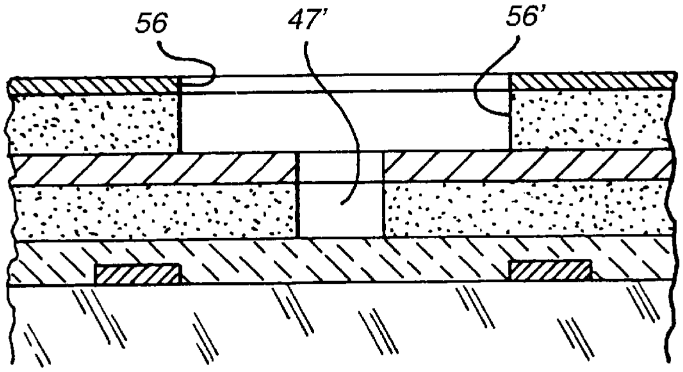
Figure 3H:
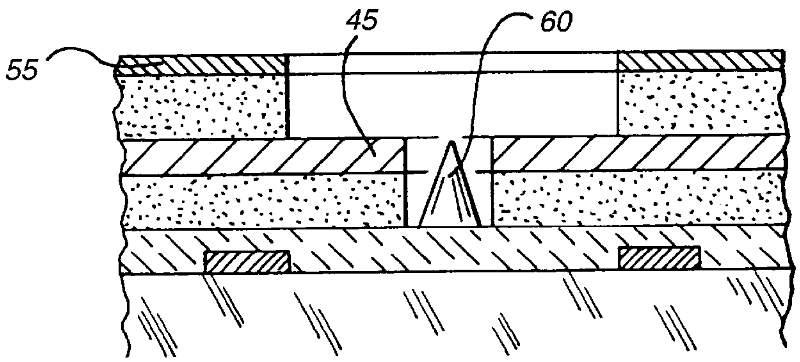

The process to create the cathode structure is continued by etching metallic layer 45 and insulating layer 44 until resistant layer 43 is reached. Since insulating layers 44 and 46 are both made of silicon in the example described, the etching of insulating layer 44 and insulating layer 46 may be performed simultaneously. As can be seen in FIG. 3G, this produces a hole 47' through conducting layer 45 and insulating layer 44 that is aligned with hole 47, together with a hole 56' that is aligned with hole 56.

The points 60 of the cathode are then produced conventionally. Once this stage has been completed the cathode is finished. Its emitters (the points), its extraction grid and focusing grid are self-aligned (see FIG. 3H).

We claim:

1. Self-alignment process usable in microelectronics to obtain alignment of at least one group of holes, one of said holes of large diamerter being formed in an upper level and the other hole of small diameter being formed in a lower level of a stacked structure, consisting of:

- providing a conducting layer in the structure, said conducting layer optionally connected to an external electrical circuit,
- disposing an insulating layer on said conducting layer,
- piercing the insulating layer with a hole of said small diameter that penetrates as far as the conducting layer, carrying out an electrolytic deposit of a conducting material in the small diameter hole using the conducting layer as the electrode during the electrolysis procedure, said electrolytic deposit filling the small diameter hole from the conducting layer and causing the deposit to overflow onto said insulating layer to give the electrolytically deposited conducting material the shape of a mushroom whose head rests on said insulating layer, the electrolytic deposition being continued until the diameter of the mushroom head attains the size of the large diameter, depositing on the structure thereby obtained a layer of a different material from the electrolytically deposited conducting material, removing the mushroom, thereby leaving a large diameter hole aligned with a small diameter hole in the last layer deposited.

2. Process of claim 1, including the following steps:

firstly deepen the small diameter hole to a given first level, then deepen the large diameter hole to a given second level that lies between the upper surface of the insulating layer and the given first layer.

3. Process according to claim 1, wherein insulating layer is pierced by etching.

4. Process according to claim 1, wherein the mushroom is removed by chemical dissolution.

5. Process for self-aligning the focusing grid with the extraction grid in a micropoint cathode, said micropoints being formed on a conducting layer and each micropoint being aligned with a small diameter hole in the extraction grid and with a large diameter hole in the corresponding focusing grid, said process comprising:

a stage in which a first insulating layer is deposited on the conducting layer, a stage in which a first conducting layer is deposited to form the extraction grid on the first insulating layer, a stage in which a second insulating layer is deposited on the first conducting layer, characterized by the fact that it also comprises:

a stage that consists of piercing the second insulating layer with small diameter holes that penetrate as far as the first conducting layer, a stage in which a conducting material is electrolytically deposited in the small diameter holes, the first conducting layer acting as the electrode during the electrolysis procedure, said electrolytic deposit filling the small diameter holes beginning at the first conducting layer and overflowing onto said second insulating layer to give the electrolytically deposited conducting material the shape of mushrooms whose heads rest on said second insulating layer, the electrolytic deposition being continued until the diameter of the mushroom heads attains the size of the large diameter, a stage in which a second conducting layer is deposited on the structure thereby obtained, said second conducting layer being designed to form the focusing grid and made of a different material from the electrolytically deposited conducting material, a stage in which the mushrooms are eliminated to leave large diameter holes in the second conducting layer, said holes being aligned with the small diameter holes, a stage in which the small diameter holes are deepened to reach the first conducting layer, a stage in which the large diameter holes are deepened to reach the first conducting layer, a stage in which the micropoints are formed.

6. Process according to claim 5, wherein the small diameter holes and the large diameter holes are deepened simultaneously.

7. Process according to claim 5, wherein the small diameter holes are obtained by etching.

8. Process according to claim 5, wherein the large diameter holes in the second insulating layer are deepened by etching.

9. Process according to claim 5, wherein the mushrooms are removed by chemical etching.

* * * * *